United States Patent [19]
Embree et al.

[11] 3,973,143
[45] Aug. 3, 1976

[54] BIAS CONTROL CIRCUITRY FOR SEMICONDUCTOR BRIDGE

[75] Inventors: Milton Luther Embree; David Clayton Goldthorp, both of Reading, Pa.

[73] Assignee: Bell Telephone Laboratories, Incorporated, Murray Hill, N.J.

[22] Filed: Dec. 27, 1974

[21] Appl. No.: 536,853

[52] U.S. Cl. .............................. 307/255; 307/254; 307/257; 323/75 E
[51] Int. Cl.² ........................................ H03K 17/00
[58] Field of Search................... 307/255, 257, 254; 328/208; 323/75

[56] References Cited
UNITED STATES PATENTS

| | | | |
|---|---|---|---|
| 3,222,547 | 12/1965 | Boan et al. | 307/257 |
| 3,700,926 | 10/1972 | Dalley | 307/257 |
| 3,721,829 | 3/1973 | Benson | 307/257 |

*Primary Examiner*—Stanley D. Miller, Jr.
*Assistant Examiner*—B. P. Davis
*Attorney, Agent, or Firm*—F. W. Padden

[57] ABSTRACT

An electronic switch is disclosed comprising a transistor bridge having input and output signaling nodes and bias control nodes. A pair of matched current sources are selectively activated and deactivated in a series arrangement with symmetrical turn-on turn-off circuitry in response to a receipt of instruction signals. The instruction signals control the gating of a constant current to the turn-on/off circuitry for enabling the matched current sources to selectively apply and withdraw matched currents from bias control nodes. Switched turn-off circuitry is employed for reverse biasing the transistor bridge in response to a deactivation of the matched current sources. A pair of voltage reference and antisaturation circuits cooperate with bridge discharge circuits to effect the reverse biasing of the bridge and to discharge rapidly the effective electrical capacitance of that bridge shortly after the receipt of a bridge turn-off instruction.

17 Claims, 2 Drawing Figures

ELECTRONIC SWITCH

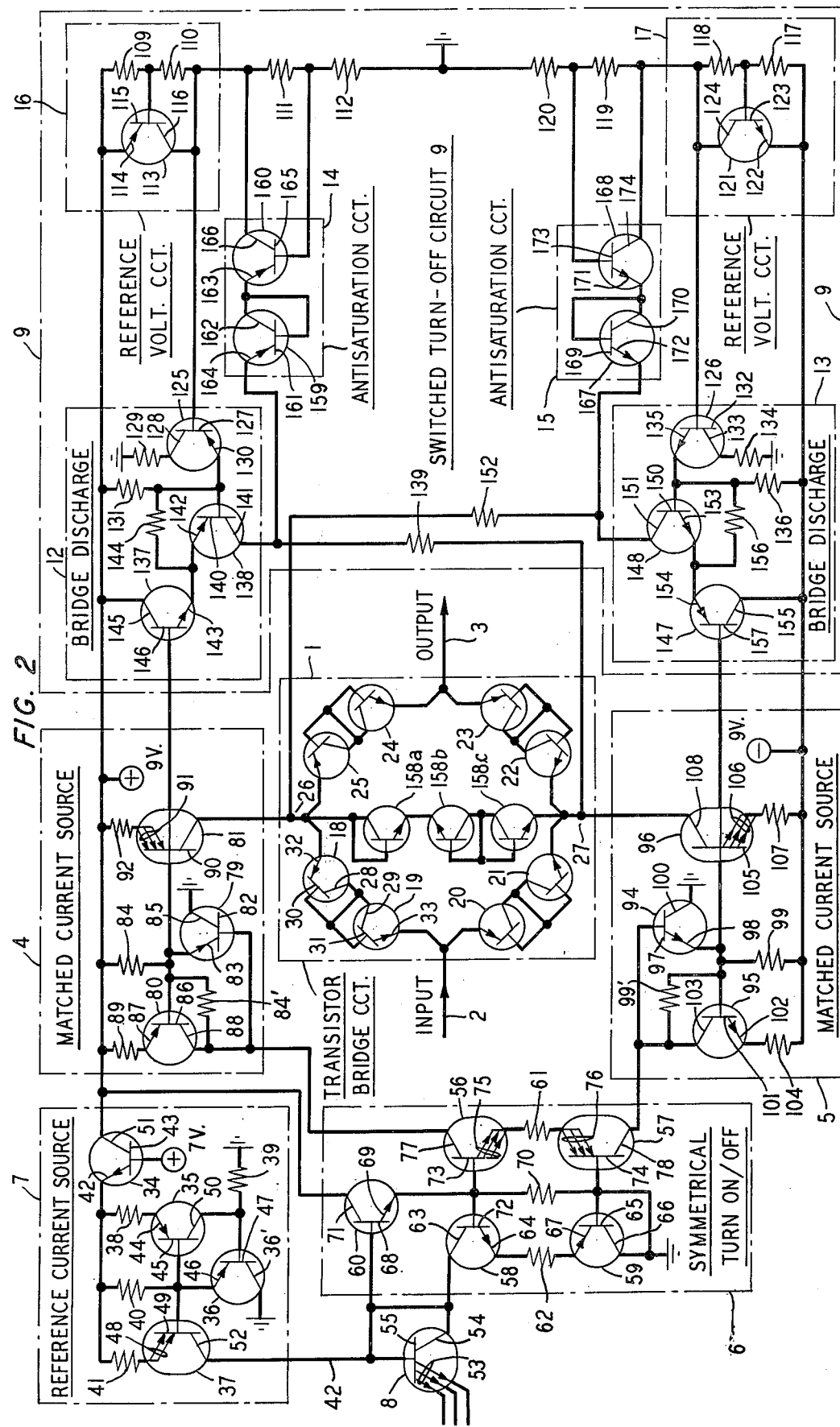

BIAS CONTROL CIRCUITRY FOR SEMICONDUCTOR BRIDGE

BACKGROUND OF THE INVENTION

This invention relates to electronic switches and particularly to circuitry for symmetrically controlling the forward and reverse bias switching of semiconductor bridge switches. The invention further relates to circuitry for improving the turn-on response of semiconductor bridges by controlling the voltage reference and antisaturation of switched turn-off circuits for the bridges.

Electronic switches utilizing diode and transistor bridges are extensively used in communication and data systems to provide for high speed switching of information. For example, such switches are used in time division switching system applications for establishing recurrent, short duration connections for telephone call processing, conversation and supervision. Among the advantages of the switches are their low power consumption, fast acting time and small size compared to electromechanical switches.

Semiconductor bridges are customarily equipped with input and output signaling nodes and a pair of bias control nodes. Information signal transmission occurs between the input and output nodes and in response to the forward biasing of the bridge semiconductors by currents supplied to the bias control nodes. In the absence of the forward bias, the bridge semiconductors substantially block signal transmission between the input and output nodes.

A problem in prior art semiconductor bridge arrangements is that the quality of transmission is often impaired by circuit and operational imbalances in switching the bridge to and from its forward biased state. The impairment frequently arises due to mismatches in the forward bias currents used to drive the bridge, as well as, the sequential application and withdrawal of those currents to and from the bias control nodes of the bridge.

It is also a deficiency in prior art semiconductor bridges that the turn-on response time is often degraded by the circuits which control a switched turn-off and steady state reverse biasing of the bridge. The degradation generally affects the information handling capacity of the system employing the bridge and, importantly, tends to cause distortion in the formation signal switched through the bridge.

In view of the foregoing, it is apparent that a need exists for facilities to improve signal transmission quality through semiconductor bridges and particularly to reduce circuit and operational imbalances which contribute to signal distortion. A further need is to provide facilities for minimizing the deficiencies including impaired bridge turn-on response time and signal distortion.

SUMMARY OF THE INVENTION

A solution to the foregoing problem and deficiencies is achieved in accordance with a specific exemplary embodiment of the invention in which circuitry is provided for symmetrically switching matched currents to and from bias control nodes of a transistor bridge and for reverse biasing the bridge under control of transistor arrangements utilizing voltage reference and active antisaturation control devices. Moreover, the switching response time of the bridge is improved by reducing the effective capacitance of the bridge by employing PNP and NPN configurations as equivalent diode quads of the bridge.

The symmetrical switching ensures that the transistors of the bridge are forward and reverse biased at substantially the same time. Symmetry is achieved by providing a pair of current sources which furnish the matched currents to the bias control nodes and by switching these current sources on and off under control of a symmetrical turn-on/off circuit. It is an advantage of this invention that the turn-on/off circuit is biaswise connected in series with both of the matched current sources in order to ensure that they are concurrently switched on and off.

The exemplary embodiment is equipped with a reference current source which supplies a constant current for activating the turn-on/off circuit. The constant current is switched to the on/off circuit under control of a logic gate and in response to turn-on and turn-off instruction signals. In response to a receipt of a turn-on instruction, the gate enables the constant current to be applied to the turn-on/off circuit for current multiplication. Advantageously, the multiplied current simultaneously drives the pair of matched current sources in series to achieve their concurrent turn-on and further to multiply the driving current for concurrent application to the bias control nodes of the bridge. This action results in the balanced forward biasing of the bridge and enables information signals to be switched through the bridge between its input and output nodes.

During the forward biasing of the bridge, its inherent, or effective, electrical capacitance between the bias control nodes is charged to a potential which in part is dependent upon the magnitude of the information signal switched between the input and output signaling nodes. This charge ordinarily would contribute to a delay in the turn-off of the bridge in response to a turn-off instruction signal. According to the exemplary embodiment, this delay is substantially reduced by a switched turn-off circuit which is provided for rapidly discharging the bridge capacitance and for reverse biasing the bridge shortly after the receipt of the turn-off instruction signal. The switched turn-off circuit advantageously comprises a pair of bridge discharge circuits which are activatable under control of the matched current sources for providing prescribed low impedance discharge paths for the bridge capacitance.

A switched turn-off of the bridge occurs in response to a receipt of a turn-off instruction signal. It causes the aforementioned logic gate to switch off the symmetrical turn-on/off circuit and, resultingly, to withdraw the in-series driving current to each of the matched current sources. This action causes both of the latter sources concurrently to be turned off for withdrawing the matched forward biasing currents from the bias control nodes. As a consequence, the matched current sources immediately activate each of the bridge discharge circuits both for concurrently applying the low impedance discharge paths across the bias control nodes to discharge the bridge capacitance and for supplying potentials to the same nodes for reverse biasing the bridge.

According to an aspect of this embodiment of our invention, the switched turn-off circuits advantageously are equipped with reference voltage and antisaturation control circuits for each of the bridge discharge circuits which are illustratively transistor arrangements. The voltage reference circuits cooperate with the antisaturation circuits to achieve currents needed to drive the discharge circuits and to control actively the degree of antisaturation produced in the discharge circuits under signal conditions. It has been proven desirable to control the antisaturation of the discharge circuits so that those circuits do not impair the aforementioned turn-on response of the bridge.

It is a feature of the present invention that an electronic switch is provided comprising a semiconductor bridge having first and second signaling terminals and bias control terminals, a pair of current sources connected to the control terminals and activatable for furnishing matched currents to the control terminals for forward biasing the bridge so that electrical information signals are conveyed between the first and second terminals, and means connecting the sources in series and responsive to a receipt of an instruction signal for concurrently activating each of the current sources to furnish the matched currents to the control terminals for forward bias of the bridge.

Another feature is that the aforementioned bias control terminals comprise first and second nodes of the bridge, the first and second terminals comprise third and fourth nodes of the bridge, and the bridge comprises separate pairs of oppositely conductive type transistors connecting the first node to the third and fourth nodes and other separate pairs of oppositely conductive type transistors connecting the second node to the third and fourth nodes of the bridge.

A further feature is that each pair of the separate pairs of transistors comprises a PNP and NPN transistor arranged effectively as series aiding diodes with emitter electrodes of the PNP and NPN transistors forming effective positive and negative electrodes of the series aiding diodes and with collector and base electrodes of the PNP and NPN transistors connected together.

Another feature of the present invention is the provision of circuitry for use with a semiconductor bridge having first and second signaling terminals, bias control terminals and first and second electrical voltages for biasing the bridge, and means connecting the voltages to the bias control terminals for steady state reverse bias of the bridge and which circuitry comprises switching means responsive during a receipt of an instruction signal for controlling the connecting means and reversing the connection of the electrical voltages to the bias control terminals for forward biasing the bridge to enable a transmission of electrical information signals between the signaling terminals. Advantageously, a departure from the prior art is that the switching means comprises a pair of switching circuits operable for switching the electrical voltages to the bias control terminals for forward biasing the bridge and means serially connected with each of the switching circuits and responsive during a receipt of said instruction signals for simultaneously operating each of the switching circuits concurrently to switch the electrical voltages to the bias control terminals for forward biasing the bridge.

A further feature is that the last-described operating means comprises a switching arrangement serially connected with each of the switching circuits and activatable for simultaneously operating both of the switching circuits, means supplying electrical signals for activating the switching arrangement, and means responsive during a receipt of the instruction signals for steering the electrical signals from the supplying means to activate the switching arrangement.

Another feature is that each of the switching circuits comprises a transistor circuit controlled by the switching arrangement and serially connected with an individual one of the electrical voltages for supplying a prescribed current to a predetermined one of the bias control terminals for forward biasing the bridge.

It is a further feature that the last-mentioned switching arrangement comprises transistor circuitry serially connected with the pair of transistor circuits for simultaneously operating both of those circuits.

Another feature is that the aforementioned means supplying electrical signals for activating the switching arrangement comprises a transistor configuration supplying a reference current for activating the transistor circuitry and that the steering means comprises a transistor logic gate responsive to the instruction signal for enabling the reference current to activate the transistor circuitry.

Another feature related to the foregoing features is that the voltage connecting means comprises a pair of switch circuits controlled by the switching means during an absence of the instruction signal for connecting the electrical voltages to the bias control terminals for steady state reverse bias of the bridge. A departure from the prior art is that the voltage connecting means further comprises means supplying reference voltages for the operation of transistor circuits in each of the switch circuits and means cooperating with the reference voltages for antisaturation control of the operations of those transistor circuits.

DESCRIPTION OF THE DRAWING

The foregoing features and advantages, as well as others, of this invention can be more fully understood from a reading of the following description with reference to the drawing in which:

FIG. 2 is a schematic drawing of the circuit arrangement of FIG. 1.

Figure 1:
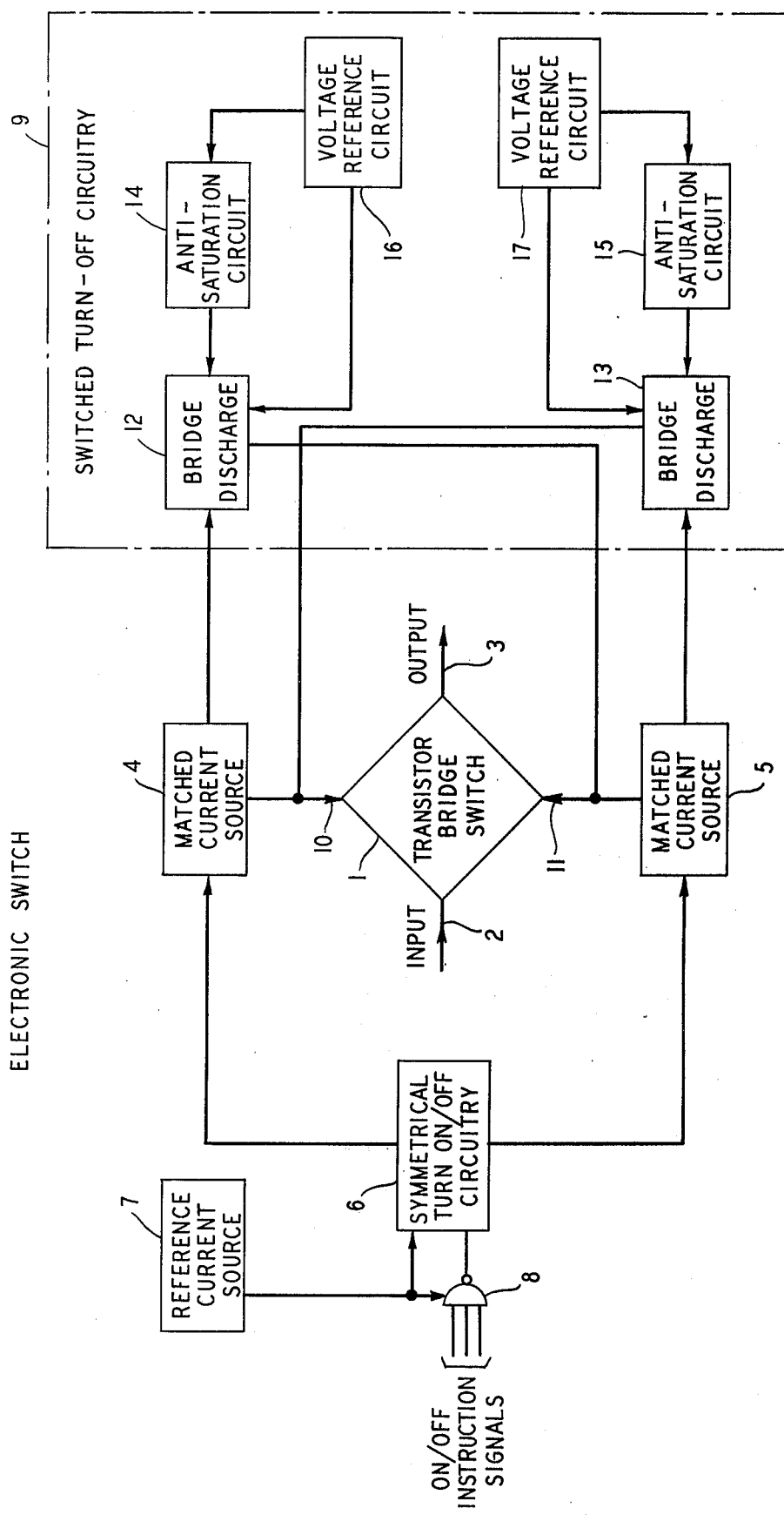
FIG. 1 is a block diagram of an electronic switch comprising a transistor diamond bridge switch which is driven by matched current sources and symmetrical turn-on/off circuitry under control of a reference current source and an input logic gate and which is controllably aided for fast switch-off by switched turn-off circuitry.

The electronic switch illustrative of principles of this invention has been designed for incorporation, by way of example, as a time division switch or crosspoint in a program controlled pulse amplitude modulation time division switching system of the type essentially as disclosed in the D. J. H. Knollman U.S. Pat. No. 3,914,559 issued Oct. 21, 1975 and assigned to the same assignee. Reference is also made to the copending D. G. Hill U.S. patent application Ser. No. 536,852 filed concurrently herewith which discloses related semiconductor bridge circuitry.

DETAILED DESCRIPTION

In FIG. 1, the illustrative time division switch comprises a transistor bridge switch 1 which has a non-operated, or OFF, state for providing a high impedance path between an input 2 and an output 3. It also has an operated, or ON, state in which it furnishes a relatively low impedance path between input 2 and output 3.

Switch 1 is biased to its OFF and ON states under control of matched current sources 4 and 5. Advantageously, the latter sources are concurrently activated and deactivated by symmetrical turn-on/off circuitry 6 and for respectively turning the switch 1 ON and OFF. The concurrent actuations and deactuations are utilized for reducing signal distortion in transmission between input 2 and output 3. Circuitry 6 is driven by a reference current source 7 and an input logic gate 8 which receives instruction signals specifying when the switch 1 is to be switched ON and OFF. In the time division system of the Knollman application, by way of example, such instruction signals are received by gate 8 from the system processor circuits via a control bus.

The exemplary electronic switch advantageously is equipped with switch turn-off circuitry 9 for the transistor bridge switch 1. An advantage of the circuitry 9 is that it does not load the bridge 1 when it is ON in its low impedance state and therefore reduces mismatching of the bias currents for that bridge. Importantly, when the bridge 1 is switched from its ON to OFF state by the circuitry 6 and current sources 4 and 5, the circuitry 9 is activated to discharge rapidly the high impedance nodes 10 and 11 of the bridge and concurrently to supply it with steady state reverse bias. The rapid discharge is desirable because a residual charge is maintained by the capacitance of devices including the transistors of bridge 1 following the bridge turn-off. The magnitude of the charge residing on the nodes 10 and 11 is dependent on the magnitude of the signal switched between input 2 and output 3. We have discovered that if the charge were not removed from the nodes, it would leak off through the bridge into the signal path from input 2 to output 3. In the illustrative time division system of Knollman, such leakage would be a source of undesired crosstalk from one time slot to another.

The turn-off circuitry comprises bridge discharge circuits 12 and 13 for providing low impedance paths of the appropriate polarity for discharging the capacitance of bridge 1. Circuits 12 and 13 are activated to effect the bridge discharge when the current sources 4 and 5 are switched by the symmetrical turn-on/off circuitry 6 for switching the bridge OFF. Each of the discharge circuits 12 and 13 is equipped with an active antisaturation circuit 14 or 15 for precluding the saturation of transistors in the respective discharge circuit 12 or 13 during the discharge of bridge 1 and for thereby improving the turn-on response of the bridge 1. Voltage reference circuits 16 and 17 establish fixed voltages for the operations of the antisaturation circuits 14 and 15 as well as the discharge circuits 12 and 13.

Turning now to FIG. 2, a fundamental building block for the electronic switch comprises the bridge circuit 1 which selectively furnishes high and low impedance paths between the input 2 and output 3. Bridge circuit 1 includes four PNP and four NPN transistors 18 through 25. The bridge is balanced in that both a PNP and an NPN transistor exist in each of the four legs comprising the bridge. Two transistors, such as transistors 18 and 19, are utilized in each leg illustratively to switch the signal voltages between the input 2 and output 3 under control of voltages supplied to bias control nodes 26 and 27 of bridge 1 by the matched current sources 4 and 5 as well as the discharge bridge circuits 12 and 13.

The PNP and NPN transistors of each leg of bridge 1 are connected together to function as series aiding diodes. This is accomplished by directly connecting together the collector and base electrodes of the PNP and NPN transistors forming a bridge leg and connecting the emitter electrode of each such transistor to an individual node of the bridge. Illustratively, the collectors 28 and 29 and bases 30 and 31 of transistors 18 and 19 are connected together and their emitters 32 and 33 are connected respectively to node 26 and the input node 2. A resultant advantage of the bridge transistor configuration is that it provides a minimal electrical capacitance at the signal input and output terminals 2 and 3.

In order to more fully appreciate the manner in which the bridge 1 is controlled to establish its high and low impedance paths between input 2 and output 3, it is desirable to explain the bias conditions provided for that bridge by the matched current sources 4 and 5, symmetrical turn-on/off circuitry 6, reference current source 7, and transistor gate 8. A starting point for the biasing of bridge 1 is the reference current source 7. It comprises an NPN and three PNP transistors 34 through 37 which cooperate with +9 volts and a regulated low impedance +7 volts and four resistors 38 through 41 to provide an output regulated reference current on a conductor 42 for the turn-on/off circuitry 6 and the transistor gate 8. The regulated current is derived from a forward biasing of transistors 34–37 via their respective emitter-base electrodes 42–43, 44–45, 46–47 and 48–49 and the resistors 38–41. The forward biasing of transistor 36 provides from its collector 36' to emitter 46 the base current drive for transistors 35 and 37. A reference current is derived from the forward biased collector 51 to emitter 42 of transistor 34 via resistor 38, the emitter 44 to collector 50 of transistor 35 and resistor 39. The magnitude of the reference current is substantially controlled by the resistor 39. By way of example, a current of twice the value of that which flows through resistor 39 flows from a collector 52 of transistor 37. This ratio is controlled by the ratio of resistors 38 and 41 with resistor 38 being twice the value of resistor 41. In addition, the multiple emitter 48 of transistor 37 is twice as large as the emitter 44 of transistor 35 for allowing twice the current flow through transistor 37 with the same base-emitter voltage drop.

The output reference current on conductor 42 is selectively switched to the symmetrical turn-on/off circuitry 6 by the logic gate 8 and in response to a receipt of input ON/OFF instruction signals from a driving signal source (not shown). Gate 8 has an ON and an OFF state. In its ON, or forward biased state, gate 8 functions to cause the turn OFF of the on/off circuitry 6 and, as a result, the turn OFF of the matched current sources 4 and 5 for switching the bridge 1 into its high impedance condition between input 2 and output 3. In its OFF, or reverse biased state, gate 8 enables the turn ON of circuitry 6 and the current sources 4 and 5 for switching bridge 1 into its low impedance condition between input 2 and output 3.

In the illustrative embodiment, gate 8 comprises TTL (Transistor Transistor Logic) having three input emitters 53, a collector 54 and a base 55. The gate functions as a diode by having its collector directly connected to its base. In response to a receipt of an input LOW instruction signal (approximately ground potential) on any one of the emitters 53, transistor 8 is forward biased to its ON state and the current on conductor 42 flows through base 55 and emitter 53 into the driving signal source (not shown) and thereby effectively bypasses the turn ON/OFF signal circuitry 6. On the other hand, when a HIGH (approximately +5 volts) instruction signal is applied to all of the emitters 53, transistor 8 is switched OFF for enabling the current on conductor 42 to switch ON the turn ON/OFF circuitry 6 and, in turn, the current sources 4 and 5 for activating bridge 1 to its low impedance condition between input 2 and output 3.

A feature of this invention is that the turn-on/off circuitry 6 is a multiplier of the reference current on conductor 42 for providing desired current drive for the current sources 4 and 5. Circuitry 6 advantageously is a means for symmetrically turning ON and OFF the current sources 4 and 5 and resultingly, the bridge 1 with minimal transmission imbalance and signal distortion between the input 2 and output 3.

The circuitry 6 may be segregated for discussion into two parts; one of which is the current multiplier comprising NPN and PNP transistors 56 and 57 and the other of which is the transistor drivers 58, 59 and 60 for transistors 56 and 57.

Current multiplication is achieved by utilizing a bias resistor 61 for transistors 56 and 57 which illustratively is about four times smaller than a bias resistor 62 for transistors 58 and 59. It is further achieved by having the base-emitter junctions of transistors 56 and 57 larger than the base-emitter junctions of transistors 58 and 59 such that illustratively four times the current can flow through transistors 56 and 57 as flows through transistors 58 and 59 with approximately the same base-emitter voltage drops. Another factor contributing to the current multiplication is the transistor arrangements of sources 4 and 5 which are serially connected to the transistors 56 and 57 as later described.

During the aforementioned OFF state of transistor gate 8, the NPN transistor 58 draws substantially all of the current on conductor 42 through its collector 63 and emitter 64, resistor 62 and PNP transistor 59 to ground potential. The bias for enabling transistor 58 to so conduct the current on conductor 42 is established in part by transistor 59 which functions as a diode inasmuch as its base 65 is connected to its collector 66 and thereby enables series aiding current to flow from its emitter 67 for transistor 58. A remainder of the bias for transistor 58 is established by transistor 60 which, during the OFF state of gate 8, draws a small amount of current from conductor 42 through its base 68 to emitter 69 and a resistor 70 for providing current drive from +9 volts through its collector 71 to emitter 69 for the bases 72 and 73 of transistors 56 and 58. By supplying such base current drive, transistor 60 buffers excessive current from being diverted from the collector 63.

In view of the foregoing, the turn-on/off circuitry 6 is a current multiplier illustratively of 4:1, that is, four times the current will flow through resistor 61 as flows through resistor 62 when gate 8 is OFF. The current is dependent principally upon the ratio of resistor 61 to 62 and the matching of the base-emitter junctions of transistors 56–59.

Thus, when gate 8 is switched OFF, as priorly explained, the reference current on conductor 42 concurrently flows through transistors 58 and 59 via resistor 62 to ground as well as through transistor 60 and resistor 70. The resultant base drive for transistor 56 concurrently forward biases its base-emitter 73–75 and the base-emitter 74–76 of transistor 57 via resistor 61 for serially supplying turn-on currents from the collectors 77 and 78 of transistors 56 and 57 to the upper and lower current sources 4 and 5.

On the other hand, when gate 8 is switched ON, as described previously, the current on conductor 42 is diverted from circuitry 6 via gate 8 to its input driving source (not shown) and, accordingly, all of the transistors 56–60 are zero biased to withhold current from sources 4 and 5 to turn them OFF. Upon such current diversion, resistor 70 removes base current from transistors 56 and 58 for enabling a rapid withdrawal of turn-on currents from sources 4 and 5 and thereby the fast turn-off of those sources and bridge 1.

Each of the current sources 4 and 5 are current multipliers which are concurrently switched ON and OFF by the turn ON and OFF of circuitry 6 and for the purpose of switching bridge 1 into its low and high impedance states, respectively. In the ON state, source 4 is equipped to switch currents from +9 volts while source 5 concurrently switches currents from −9 volts to provide for the low impedance condition of bridge 1 and whereby signals at input 2 are transferred to output 3 via that bridge. In the OFF state, sources 4 and 5 are effective for switching bridge 1 to its high impedance, or essentially open circuit, condition whereby no signal is exchanged between input 2 and output 3.

Current source 4 comprises three PNP transistors 79, 80 and 81. In the OFF state of source 4, only leakage currents flow through the latter transistors because transistor 56 of circuitry 6 is reverse biased. However, in the ON state, all three PNP transistors and transistor 56 are conducting. Accordingly, current is drawn from collector 77 of transistor 56 through the base 82 to emitter 83 of transistor 79 and resistor 84 to +9 volts. As a result, transistor 79 provides base current drive for transistors 80 and 81 via its collector 85-emitter 83. The drive from transistor 79 forward biases the base 86-emitter 87 of transistor 80 and enables substantially all of the current supplied from the collector 77 of transistor 56 to flow through the collector 88-emitter 87 of transistor 80 and resistor 89 to +9 volts. Transistor 81 also responds to the base current drive from transistor 79 by a forward conduction of its base 90-emitter 91 through resistor 92 to +9 volts. Resultingly, current flows through resistor 92 and the emitter 91 to collector 93 of transistor 81 for switching bridge 1 to its low impedance conducting condition as hereinafter explained.

Advantageously, the emitter-base junctions of transistor 81 are made sufficiently large so that the forward biased base-emitter voltages of transistors 81 and 80 are substantially equal. With this construction and parameter, the magnitude of the current which flows through resistor 92 essentially depends on the ratio of the resistors 89 to 92. In the illustrative embodiment, the ratio is approximately 6:1 and, therefore, the collector current of transistor 80 is multiplied six times in the collector 93 of transistor 81 for driving bridge 1.

Current source 5 is functionally the same as source 4, except that for polarity reasons in working with −9 volts and another node 27 of bridge 1, it employs three NPN transistors 94, 95 and 96. In its OFF state, all of the latter transistors are nonconducting. All three transistors conduct in the ON state of source 5 and under control of current drawn via the collector 78 of transistor 57 in circuitry 6. To elaborate, transistor 94 draws a small percentage of the current of collector 78 through its base 97-emitter 98 and resistor 99 to −9 volts. Accordingly, transistor 94 conducts current through its collector 100-emitter 98 for providing base current drive for transistors 95 and 96. The base drive forward biases the base 101-emitter 102 of transistor 95 and enables substantially all of the collector current of transistor 57 to flow through the collector 103-emitter 102 of transistor 95 and resistor 104 to −9 volts. Transistor 96 also responds to the base current drive from transistor 94 with a forward conduction of its base 105-emitter 106 through resistor 107 and the emitter 106 to collector 108 of transistor 96 for fully switching bridge 1 to its low impedance conducting condition.

As in the case of source 4, the emitter-base junctions of transistor 96 in source 5 are made sufficiently large so that the forward biased base-emitter voltages of transistors 95 and 96 are substantially equal. Accordingly, current multiplication of source 5 depends upon the ratio of resistor 104 to 107 which, in the illustrative embodiment, is 6 to 1. Thus, the collector current of transistor 96 is six times the magnitude of that of transistor 95.

Resistors 84' and 99' are included in current sources 4 and 5 to speed up their turn-off time by pulling base charge out of the transistors 79 and 94.

It is advantageous to note at this juncture that a common current for symmetrical circuit control of the bridge 1 flows through transistors 56 and 57 of circuitry 6 and through transistors 80 and 95 and resistors 89 and 104 of sources 4 and 5. Importantly, a concurrent common current also flows through sources 4 and 5 as well as bridge 1 for biasing that bridge to its low impedance condition and for thereby enabling it to effect a signal transfer between input 2 and output 3. The latter current flows when ON states exist concurrently for circuitry 6 and sources 4 and 5 and gate 8 is in its off state. It flows from −9 volts through resistor 107 and emitter 106-collector 108 through paths of the diode connected transistors 21, 20, 19 and 18 in parallel with transistors 22, 23, 24 and 25, and thence through the collector 93-emitter 91 and resistor 92 to +9 volts. Each of the latter transistors is, of course, forward biased in the last-described path.

Typical signal transfer from the input 2 to output 3 through bridge 1 when it is forward biased is achieved on a signal current additive and subtractive basis with the matched currents applied to the bias control nodes 26 and 27. In the forward biased state, the transistors 18–25 of bridge 1 exhibit a relatively low impedance AC path between the input and output signaling nodes 2 and 3. It is to be understood that the signal transfer from input 2 to output 3 is only illustrative inasmuch as the illustrative circuit arrangement of FIG. 2 is operable for bidirectional signal transfer between input 2 and output 3. Accordingly, transmission balance and minimal signal transfer distortion between input 2 and output 3 is achieved by the symmetrical turn ON of the bridge under control of the circuitry 6 cooperating with the sources 4 and 5 and by the matching of transistors and resistors in the circuitry 6, current sources 4 and 5 and bridge 1.

The electrical capacitance of bridge 1 retains for a period of time a residual charge between its nodes 26 and 27 following the receipt of a turn-off instruction by gate 8 and the desired switch OFF of bridge 1. This charge ordinarily would decay, but while doing so, would tend to bias and hold bridge 1 in its low impedance condition for an undesired duration following the receipt of the turn-off instruction by gate 8 and the sequential turn-off of gate 8, circuitry 6 and sources 4 and 5.

In a high speed data or other communication system, such as a time division switching system where the bridge is usable to connect communication signals to a bus in distinct time slots, the residual holdover charge and low impedance condition of bridge 1 could contribute to undesired crosstalk. It is therefore preferable that the charge be rapidly removed after the turn-off instruction is received. The charge in the exemplary embodiment is of a polarity which illustratively is with respect to nodes 26 and 27 of bridge 1, positive at node 26 and minus to node 27.

The exemplary embodiment provides for the rapid discharge of the bridge capacitance following a bridge turn-off controlled by gate 8. It advantageously does so by means of the switched turn-off circuit 9. The latter includes the bridge discharge circuits 12 and 13 which are operable to provide low impedance discharge paths for the bridge capacitance by concurrently connecting node 26 through a low impedance to −9 volts and node 27 through a low impedance to +9 volts. The discharge circuits 12 and 13 are connected to transistors 81 and 96 of the sources 4 and 5 and are operated for effecting the bridge discharge in response to the concurrent turn OFF of those sources by circuitry 6 under control of gate 8 and its input OFF instruction signals.

Discharge circuits 12 and 13 perform the bridge discharge function with the aid of antisaturation circuits 14 and 15 and reference voltage circuits 16 and 17. Both of the latter circuits furnish low impedance reference voltages of desired polarities with respect to the +9 and −9 volt supplies. Circuit 16 comprises a voltage divider network including resistors 109 through 112 serially connected between +9 volts and ground. It also comprises a PNP transistor 113 having its emitter 114 connected to +9 volts, its base 115 connected to a junction of resistor 109 and 110, and its collector 116 connected to a junction of resistors 111 and 110. Thus, transistor 113 is forward biased and establishes a positive reference voltage at its collector 116 which is temperature compensated in that it is dependent on the base 115-emitter 114 voltage drop.

Circuit 17 provides a negative reference voltage in a manner similar to that in which circuit 16 provides a positive reference voltage. Circuit 17 also comprises a voltage divider including resistors 117 through 120 serially connected between +9 volts and ground. It further comprises an NPN transistor 121 with its emitter 122 connected to −9 volts, its base 123 connected to a junction of resistors 117 and 118, and its collector 124 connected to a junction of resistors 119 and 118. Therefore, transistor 121 is forward biased and furnishes a negative reference voltage at its collector 124.

The reference voltages at the collectors 116 and 124 are utilized to operate respective PNP and NPN transistors 125 and 126 in the bridge discharge circuits 12 and 13 for providing low impedance voltage sources for transistors 138 and 148. Transistor 125 is arranged to operate in an active state with its base 127 connected to the reference voltage at collector 116 and its collector 128 connected through resistor 129 to ground. An emitter 130 of transistor 125 is connected to +9 volts via a resistor 131 in discharge circuit 12 and provides current drive for that circuit. Similarly, transistor 126 actively conducts by virtue of its base 132 being connected to the reference voltage at collector 124 and its collector 133 being connected through resistor 134 to ground. Emitter 135 of transistor 126 is connected to −9 volts via a resistor 136 in discharge circuit 13 and provides current drive for that circuit.

Discharge circuit 12 includes an NPN and a PNP transistor 137 and 138 which in conjunction with resistor 139 provide a current path from +9 volts to node 27 for concurrently cooperating with discharge circuit 13 to discharge the bridge capacitance. Transistor 138 has its base 140 connected essentially to a fixed reference voltage at the emitter 130, its collector 141 connected to node 27 via resistor 139, and its emitter 142 connected to an emitter 143 of transistor 137. Emitter 143 is also connected through resistors 144 and 131 to +9 volts. Transistor 137 has its collector 145 connected to +9 volts and its base 146 connected to the base 90 of transistor 81 in source 4. In the ON state of source 4, the potential at the base 90 is sufficient to bias OFF transistors 137 and 138 and thereby reflect a high impedance across bridge 1.

Circuit 13 similarly includes a PNP and NPN transistor 147 and 148 which cooperate with a resistor 152 to provide a current path from −9 volts to node 26 for discharging the bridge capacitance. Transistor 148 has its base 150 connected essentially to the fixed reference voltage at the emitter 135, its collector 151 connected to node 26 via resistor 152, and its emitter 152 connected to an emitter 154 of transistor 147. The latter has its collector 155 connected to −9 volts its emitter 154 connected via resistors 156 and 136 to −9 volts, and its base 157 connected to the base 105 of transistor 96 in source 5. In the ON state of source 5, the potential at the base 105 is sufficient to bias OFF transistors 147 and 148 for presenting a high impedance across bridge 1.

The discharge of the bridge capacitance is initiated when current sources 4 and 5 are switched OFF by circuitry 6 and gate 8 and all transistors in those sources turn OFF. As a result, the potentials at bases 90 and 105 of transistor 81 and 96 are simultaneously switched to +9 and −9 volts, respectively. The latter action concurrently forward biases transistors 137, 138, 147 and 148 of discharge circuits 12 and 13 and thereby connects nodes 26 and 27 through low impedance discharge paths to −9 and +9 volts, respectively. The discharge path extends from node 26 through resistor 152, collector 151, emitters 153 and 154, and collector 155 to −9 volts. The path further extends from node 27 through resistor 139, collector 141, emitters 142 and 143, and collector 145 to +9 volts. The foregoing paths thus enable all of the transistors of bridge 1 to be reversed biased. Concurrently, the transistors of discharge circuits 12 and 13 remain forward biased until sources 4 and 5 are again switched ON by circuitry 6 and gate 8 under control of input ON instruction signals.

In the reverse biased state of bridge 1, it is desirable to provide a low impedance shunt between the bias control nodes 26 and 27 for limiting signal feedthrough between input and output nodes 2 and 3. This is accomplished in the illustrative embodiment by utilizing three diode connected NPN transistors 158a–158c between nodes 26 and 27. Transistors 158a and 158c are connected as series aiding diodes while transistor 158b is oppositely connected with the transistors 158a and 158c. Illustratively, the base-emitter junctions of transistors 158a–158b cooperate in breakdown along with resistors 139 and 152, and the transistors of circuits 12 and 13 to reverse bias the bias control nodes 26 and 27 at voltages equal to one half of the breakdown voltages of transistors in each leg of the bridge 1. This biasing configuration, by way of example, optimizes the maximum allowable signal which can be controlled by switch 1 and centers its operating voltage range at approximately ground potential.

It is a feature of the exemplary embodiment that the antisaturation circuits 14 and 15 are connected to the collectors 141 and 151 of transistors 138 and 148 for precluding the latter transistors from saturating when the bridge capacitance has discharged. Such saturation would ordinarily cause transistors 138 and 148 to remain ON for a short period of time after sources 4 and 5 are switched ON as priorly explained and would cause imbalance of the forward bias currents through bridge 1. In addition, the antisaturation circuits 14 and 15 provide a low AC impedance effectively to ground for bridge nodes 26 and 27 via resistors 139 and 152 and thereby minimize signal feedthrough and resultant crosstalk.

Circuit 14 comprises a pair of PNP transistors 159 and 160. Transistor 159 is arranged as a diode with its base 161 connected to its collector 162 which, in turn, is connected to an emitter 163 of transistor 160. The emitter 164 of transistor 159 is connected to a junction of resistor 139 and collector 141 of transistor 138. Bias for controlling the amount by which transistor 138 is kept out of saturation is derived across resistor 111 and connected to the base 165 and collector 166 of transistor 159.

Similarly, circuit 15 comprises a pair of NPN transistors 167 and 168. Transistor 167 is arranged as a diode with its base 169 connected to its collector 170 which is, in turn, connected to an emitter 171 of transistor 168. The emitter 172 of transistor 167 is connected to a junction of resistor 152 and collector 151 of transistor 148. Bias for controlling the amount by which transistor 168 is kept out of saturation is derived across resistor 119 and connected to the base 173 and collector 174 of transistor 168.

Accordingly, when transistors 138 and 148 are switched ON as priorly explained and the voltages at their respective collectors 141 and 151 begin to approach that of the respective emitter 142 and 153, transistors 160 and 168 turn ON or begin to turn ON and draw currents through resistors 111 and 119, respectively. This causes the voltages across resistors 111 and 119 to increase and, thus the voltages from bases 140 and 150 to emitters 142 and 153 of transistors 138 and 148 to be reduced. This, in turn, causes a reduction in the current flow through transistors 138 and 148. The illustrative embodiment is arranged so that the collector to emitter voltages of transistors 138 and 148 are held at approximately 0.3 volts when they are turned ON and thus keep them just slightly out of saturation.

It has been found that when transistors 138 and 148 initially turn ON and are in the active mode of discharging nodes 26 and 27, transistors 138 and 148 are hard driven and excess charge builds up in the bases of transistors 138 and 148. This charge may cause the latter transistors to go momentarily into saturation in spite of the antisaturation circuits. The saturations are overcome by circuits 14 and 15 and when they are, the turn-on response time of bridge 1 is improved. With prior art arrangements for anti-saturation control, such as those using diode configurations, the voltage rise at the bias control nodes 26 and 27 would be objectionably high as a result of the switching actions of circuits 12 and 13. Such voltages would therefore contribute to undesired signal feedthrough to the output signaling node 3.

It is to be understood that the foregoing arrangements are illustrative of the principles of this invention. In light of this teaching, it is apparent that numerous other arrangements may be devised by those skilled in the art without departing from the spirit and scope of the invention.

What is claimed is:

1. An electronic switch comprising:
   a semiconductor bridge having first and second signaling terminals and bias control terminals,
   a pair of current sources connected to said control terminals and activatable for providing matched currents to said control terminals for forward biasing said bridge to convey electrical information signals between said first and second terminals, and
   means connecting said sources in series and responsive to a receipt of an instruction signal for serially applying a joint electrical bias concurrently to both of said sources and for activating each of said sources to provide said matched currents to said control terminals for said forward bias of said bridge.

2. The invention of claim 1 wherein
   said bias control terminals comprise first and second nodes of said bridge,
   said first and second signaling terminals comprise third and fourth nodes of said bridge, and
   said bridge comprises
   separate pairs of oppositely conductive type transistors connecting said first node to said third and fourth nodes and other separate pairs of oppositely conductive type transistors connecting said second node to said third and fourth nodes.

3. The invention of claim 2 wherein each pair of said separate pairs of transistors comprises a PNP and an NPN transistor arranged effectively as series aiding diodes with emitter electrodes of said PNP and NPN transistors forming effective positive and negative electrodes of said series aiding diodes and with collector and base electrodes of said PNP and NPN transistors connected together.

4. An electronic switch comprising:
   a semiconductor bridge having first and second signaling terminals and bias control terminals,
   a pair of current sources connected to said control terminals and activatable for providing matched currents to said control terminals for forward biasing said bridge to convey electrical information signals between said first and second terminals,
   means connecting said sources in series and responsive to a receipt of an instruction signal for concurrently activating each of said sources to provide said matched currents to said control terminals for said forward bias of said bridge, and
   said current sources activating means comprises:
   means for supplying a prescribed reference current, and
   means responsive to a receipt of said reference current for multiplying said reference current for concurrently activating each of said current sources to supply said matched currents to said control terminals for said forward bias of said bridge.

5. The invention of claim 4 further comprising means responsive to a receipt of instruction signals for selectively gating said reference current from said supplying means to said reference current multiplying means.

6. The invention of claim 4 wherein each of said current sources comprises
   means cooperating with said reference current multiplying means for controlling a generation of the multiplied reference current and
   means activated by the generated multiplied reference current for cooperating with said bridge concurrently to supply said substantially matched currents at said bias control terminals.

7. The invention of claim 1 wherein
   said activating means comprises gating means responsive to other instruction signals for controlling said current sources activating means for altering said joint electrical bias concurrently to both of said sources and concurrently deactivating said current sources simultaneously to withdraw both said matched currents and said forward bias to said bridge, and
   further comprising means responsive to the deactivation of said current sources for connecting reverse bias voltages to said bridge bias control terminals.

8. The invention of claim 7 wherein
   said bridge comprises an effective electrical capacitance chargeable during the application of said matched currents of said control terminals,
   said reverse bias voltages connecting means comprises a pair of discharge circuits responsive to a deactivation of said current sources for switching said reverse bias voltages to said bridge bias control terminals,
   each of said discharge circuits comprises a transistor switching circuit forward biased in response to the deactivation of a predetermined one of said current sources for switching one of said reverse bias voltages to one of said bias control terminals, and
   further comprising means for generating reference voltages and
   circuit means cooperating with said reference voltages for antisaturation control of the forward bias of each of said transistor circuits.

9. For use with a semiconductor bridge having
   first and second signaling terminals,
   bias control terminals and
   first and second electrical voltages for bias control of said bridge,
   a switchable bridge turn-off circuit activatable for connecting said electrical voltages to said bias control terminals for steady state reverse bias of said bridge,
   switching means responsive during a receipt of an instruction signal for deactivating said turn-off circuit and reversing the connection of said electrical voltages to said bias control terminals for forward biasing said bridge to enable a transmission of electrical information signals between said signaling terminals, and
   said switching means comprising
   a pair of switching circuits operable for switching said electrical voltages to said bias control terminals for forward biasing said bridge, and
   control means serially connecting both of said switching circuits and responsive during a receipt of said instruction signals for serially applying a joint electrical signal concurrently to both of said switching circuits and simultaneously operating each of said switching circuits concurrently to switch said electrical voltages to said bias control terminals for forward biasing said bridge.

10. The invention of claim 9 wherein said control means comprises a switching arrangement serially connecting both of said switching circuits and activatable for simultaneously operating both of said switching circuits, means supplying electrical signals for activating said switching arrangement, and means responsive during a receipt of said instruction signals for steering said electrical signals from said supplying means to activate said switching arrangement.

11. The invention of claim 10 wherein each of said switching circuits comprises a transistor circuit controlled by said switching arrangement and serially connected with an individual one of said electrical voltages for supplying a prescribed current to a predetermined one of said bias control terminals for forward biasing said bridge.

12. The invention of claim 11 wherein said switching arrangement comprises transistor circuitry serially connected with each said transistor circuit and activatable for simultaneously operating each said transistor circuit.

13. The invention of claim 12 wherein said supplying means comprises a transistor arrangement supplying a reference current for activating said transistor circuitry, and said steering means comprises a transistor logic gate responsive to said instruction signal for enabling said reference current to activate said transistor circuitry.

14. Control circuitry for use with a semiconductor bridge having first and second signaling terminals, bias control terminals, control means activated and deactivated in response to a receipt of instruction signals for enabling and disabling said bridge to transmit electrical information signals between said signaling terminals, and said circuitry comprising transistor means conductive upon a deactivation of said control means for concurrently connecting reverse bias voltages to said bias control terminals, and means responsive to said voltages for actively controlling the magnitude of the conduction of said transistor means, and wherein said transistor means comprises a pair of transistor circuits responsive to a deactivation of said control means for connecting said reverse bias voltages to said bias control terminals, and said actively controlling means comprises means responsive to said bias voltages for supplying reference voltages for said pair of transistor circuits and means cooperating with said reference voltages for antisaturation control of the forward bias conduction of each of said transistor circuits.

15. Control circuitry for use with a semiconductor bridge having first and second signaling terminals and bias control terminals, said circuitry comprising a pair of switching circuits operable for connecting electrical signals to said bias control terminals for forward biasing said bridge to transmit electrical information signals between said signaling terminals, and means serially connecting said pair of circuits and responsive to a receipt of an instruction signal for concurrently operating both of said circuits for connecting said forward bias electrical signals to said bias control terminals.

16. The invention of claim 15 wherein each of said switching circuits comprises a transistor circuit for supplying a prescribed current to an individual one of said bias control terminals for forward bias of said bridge, and said operating means comprises a transistor arrangement serially connecting each said transistor circuit and being activated in response to said instruction signal for concurrently forward biasing each said transistor circuit to supply said prescribed current.

17. The invention of claim 16 wherein said operating means further comprises means providing a reference current for activating said transistor arrangement and a logic gate responsive to a receipt of said instruction signal for switching said reference current to activate said transistor arrangement.

* * * * *